(12) United States Patent
Smithson et al.

(10) Patent No.: US 10,799,042 B2
(45) Date of Patent: Oct. 13, 2020

(54) POINT-OF-PURCHASE (POP) DISPLAY

(71) Applicant: Xerox Corporation, Norwalk, CT (US)

(72) Inventors: Chad S. Smithson, Guelph (CA); Yujie Zhu, Mississauga (CA); Kurt I. Halfyard, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 16/265,196

(22) Filed: Feb. 1, 2019

(65) Prior Publication Data
US 2020/0245785 A1    Aug. 6, 2020

(51) Int. Cl.
| | |
|---|---|
| H05K 5/00 | (2006.01) |
| A47F 10/02 | (2006.01) |
| G09F 27/00 | (2006.01) |
| A47F 5/11 | (2006.01) |
| A47F 11/10 | (2006.01) |
| H05K 1/18 | (2006.01) |
| H05K 1/02 | (2006.01) |
| H05K 7/02 | (2006.01) |
| G09F 5/00 | (2006.01) |

(52) U.S. Cl.
CPC .............. *A47F 10/02* (2013.01); *A47F 5/116* (2013.01); *A47F 11/10* (2013.01); *G09F 27/005* (2013.01); *H05K 1/028* (2013.01); *H05K 1/189* (2013.01); *H05K 7/02* (2013.01); *A47F 2010/025* (2013.01); *G09F 5/00* (2013.01); *H05K 5/0017* (2013.01); *H05K 2201/0999* (2013.01)

(58) Field of Classification Search
USPC ......................................................... 361/757
See application file for complete search history.

(56) References Cited

U.S. PATENT DOCUMENTS

| | | | | |
|---|---|---|---|---|
| 5,348,485 | A * | 9/1994 | Briechle ................ | H01R 25/14 439/110 |
| 6,570,492 | B1 * | 5/2003 | Peratoner ................ | G06F 3/147 340/12.3 |
| 6,825,829 | B1 | 11/2004 | Albert et al. | |
| 6,835,950 | B2 | 12/2004 | Brown et al. | |
| 6,924,781 | B1 | 8/2005 | Gelbman | |
| 2005/0040934 | A1 * | 2/2005 | Shanton ................... | A47F 5/11 340/5.92 |
| 2016/0066854 | A1 | 3/2016 | Mei et al. | |

* cited by examiner

*Primary Examiner* — Hung S. Bui
(74) *Attorney, Agent, or Firm* — Hoffman Warnick LLC

(57) ABSTRACT

There is described a point-of-purchase display and method. The display includes one or more sheets. The one or more sheets when unfolded and assembled form the display. The display includes a back wall, a front wall, at least a side wall and a bottom wall. A printed electronic device is affixed to a surface of the one or more sheets. The printed electronic device is selected from the group consisting of: wires, insulators, resistors, capacitors, inductors, transformers, transistors, antennas, OLEDs and sensors. A microcontroller electrically is coupled to the printed electronic device. A connection device is coupled to the printed electronic device. A modular electronic component is coupled to the connection device.

14 Claims, 6 Drawing Sheets

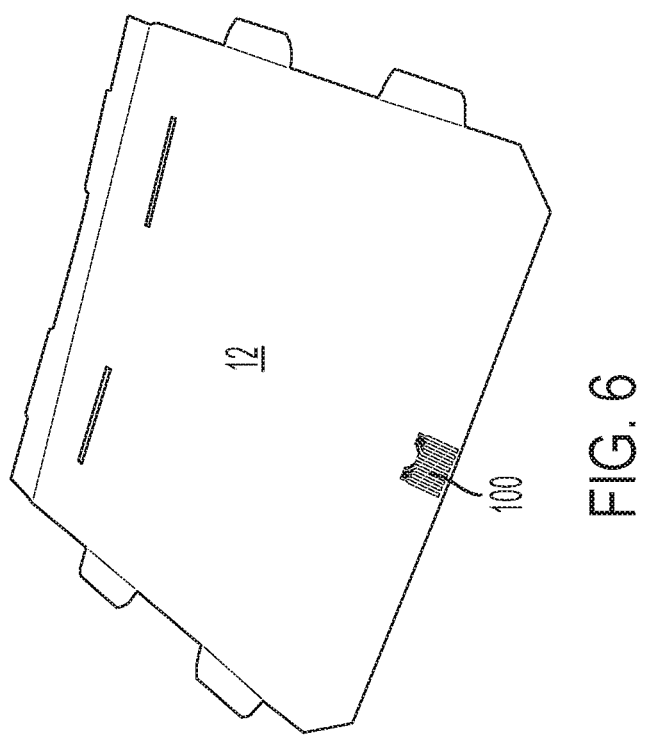

POINT-OF-PURCHASE (POP) DISPLAY

CROSS REFERENCE TO RELATED APPLICATIONS

This application relates to commonly assigned co-pending application Ser. No. 16/265,190, MODULAR POINT-OF-PURCHASE DISPLAY, filed simultaneously herewith and incorporated by reference herein.

BACKGROUND

Field of Use

The disclosure herein is directed to point-of-purchase (POP) displays and their manufacture.

Background

Brand owners and manufacturers produce cardboard/paperboard marketing displays know as Point-of-Purchase (POP) displays to be deployed in stores. These displays are often temporary and typically placed in high customer traffic areas or at the end of an aisle. POP displays are commonly used to promote a new product, a new product feature, seasonal products and combo packs. POP displays have been shown to boost sales when compared to the same product being on a regular store shelf. Both basic and elaborate displays with unique designs and printed imagery are used to catch the attention of consumers. These displays increase product visibility, impulse purchases and help highlight specific products.

An important distinction to make is the difference between a POP display and a Point of Sale (POS) display. A POS display promotes products at the exact space where purchases can be made, while at a POP display, you cannot actually purchase the product, only learn more about it.

Examples of complex POP displays incorporating electronics can be found. These displays use wiring to connect to traditional electronic circuit boards driving functionality. However, such POP displays that include complex electronics have to be assembled and shipped which is expensive. An employee of the POP vendor may be sent to assemble the display on site.

A need exists for POP displays that include complex electronics and can be shipped as flat panels or sheets.

SUMMARY

In one aspect, there is described a point-of-purchase display. The display includes one or more sheets. The one or more sheets when unfolded and assembled form the display. The display includes a back wall, a front wall, at least a side wall and a bottom wall. A printed electronic device is affixed to a surface of the one or more sheets. The printed electronic device is selected from the group consisting of: wires, insulators, resistors, capacitors, inductors, transformers, transistors, antennas, OLEDs and sensors. A microcontroller electrically is coupled to the printed electronic device. A connection device is coupled to the printed electronic device. A modular electronic component is coupled to the connection device.

In another aspect, there is provided a point-of-purchase display. The display includes one or more sheets which can be unfolded and assembled to form the display. The display includes a back wall, a front wall, at least one side wall, at least one a shelf, and a bottom wall. A printed electronic device is affixed to a surface one of the one or more sheets. The printed electronic device is selected from the group consisting of: wires, insulators, resistors, capacitors, inductors, transformers, transistors, antennas, OLEDs and sensors. A microcontroller is electrically coupled to the printed electronic device. A connection device is electrically coupled to the printed electronic device. A modular component is electrically coupled to the connection device.

In another aspect, there is provided a method of providing a point-of-purchase display. The method includes shipping one or more sheets to a site. The one or more sheets include a back wall, a front wall, at least one side wall, and a bottom wall. A printed electronic device is affixed to a surface one the one or more sheets. The printed electronic device is selected from the group consisting of: wires, insulators, resistors, capacitors, inductors, transformers, transistors, antennas, OLEDs and sensors, wherein the one or more sheets are foldable and capable of being assembled into a three dimensional display.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

FIG. 6 is a depiction of a sheet for a POP display according to embodiments of the disclosure.

Figure 8:
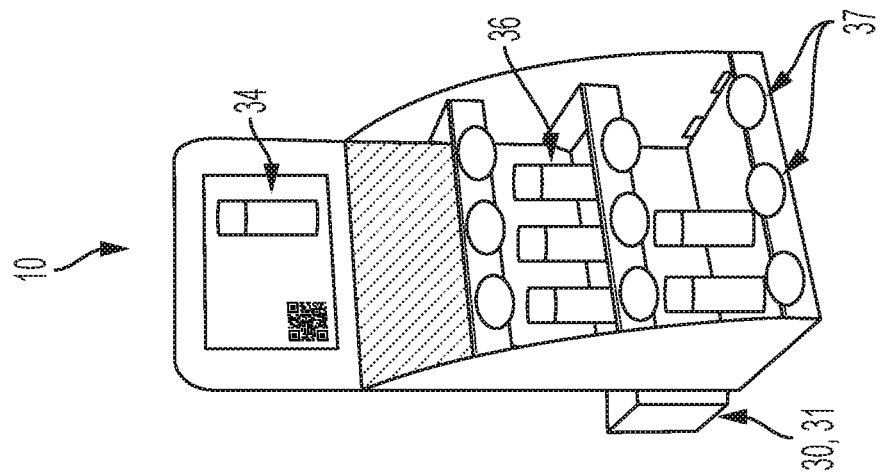
FIG. 8 is a depiction of an empty POP display having electronic components according to embodiments of the disclosure.

It should be noted that some details of the FIGS. have been simplified and are drawn to facilitate understanding of the embodiments rather than to maintain strict structural accuracy, detail, and scale.

DETAILED DESCRIPTION OF THE EMBODIMENTS

Reference will now be made in detail to embodiments of the present teachings, examples of which are illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Illustrations with respect to one or more implementations, alterations and/or modifications can be made to the illustrated examples without departing from the spirit and scope of the appended claims. In addition, while a particular feature may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

Although embodiments of the disclosure herein are not limited in this regard, the terms "plurality" and "a plurality" as used herein may include, for example, "multiple" or "two or more." The terms "plurality" or "a plurality" may be used throughout the specification to describe two or more components, devices, elements, units, parameters, or the like. For example, "a plurality of resistors" may include two or more resistors.

When an element is referred to as being "on", "engaged to", "connected to" or "coupled to" another element, it may be directly on, engaged, connected or coupled to the other element, or intervening elements may be present. In contrast, when an element is referred to as being "directly on," "directly engaged to", "directly connected to" or "directly coupled to" another element or layer, there may be no intervening elements present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Disclosed herein is an approach to making foldable and collapsible POP displays utilizing complex printed electronics on the substrates. The POP display includes flat sheets. The flat sheets are shipped to the site where the POP display is presented to potential customers. The flat sheets are folded per the instructions, and assembled to form the POP display. The flat sheets have a printed electronic device on at least one surface.

Figure 1:
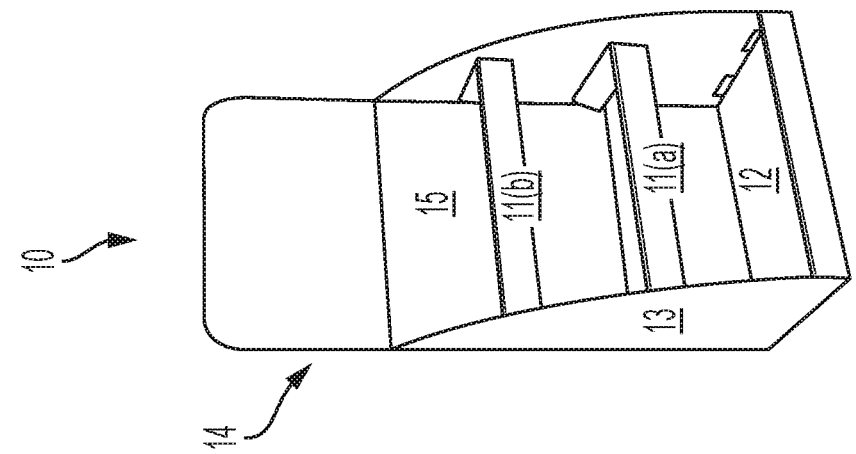
FIG. 1 is a depiction of a POP display according to embodiments of the disclosure.

FIG. 1 shows a POP display 10. The blank POP display 10 is made of a substrate, such as cardboard, wood, acrylic or metal. The substrate is in flat sheet form, that is, it can be packed flat. The sheets for the POP displays are folded and assembled through insertion into perforations to create the POP display 10. Instructions on folding and assembly are included with the flat sheets. The POP display 10 includes at least one shelf 11(a) and 11(b), at least one of a bottom wall 12, at least one side wall 13, a back wall 14 and a front wall 15. The back wall 14 and front wall 15 can be opposite sides of the same sheet of substrate. The sheets of the POP display 10 are shipped flat. The front and back wall (14 and 15), the bottom wall 12, the side walls 13 and shelves 13 are assembled on site.

Modular electronic components, power supply and controller or microcontroller can be provided on site or shipped in separately.

Figure 3:
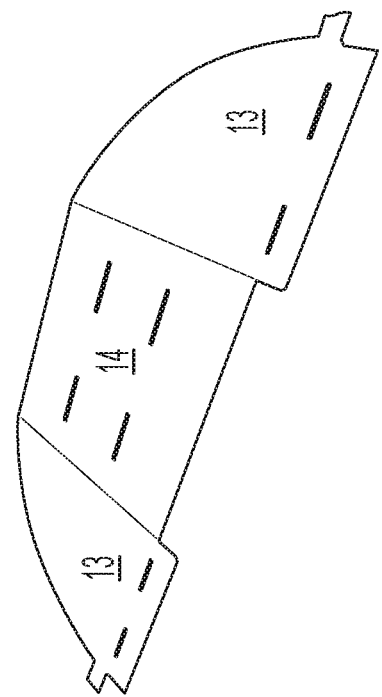
FIG. 3 is a depiction of a sheet for a POP display according to embodiments of the disclosure.
Figure 2:
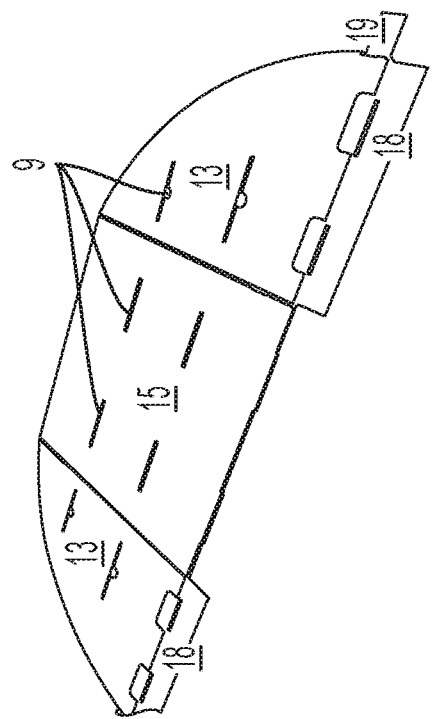
FIG. 2 is a depiction of a sheet for a POP display according to embodiments of the disclosure.

FIGS. 2 and 3 show a flat sheet that forms side walls 13, front wall 15 and back wall 14 of a POP display. The sheet shown in FIGS. 2 and 3 has been perforated with perforations 9 and cut for final assembly of the POP display 10 (FIG. 1). Briefly, sidewalls 13 are folded forming the front wall 15, back wall 14 and sidewalls of the POP display 10 in FIG. 1. Tabs 18 are folded upwards. Tabs 19 are inserted into folded sides of bottom wall 12

Figure 4:
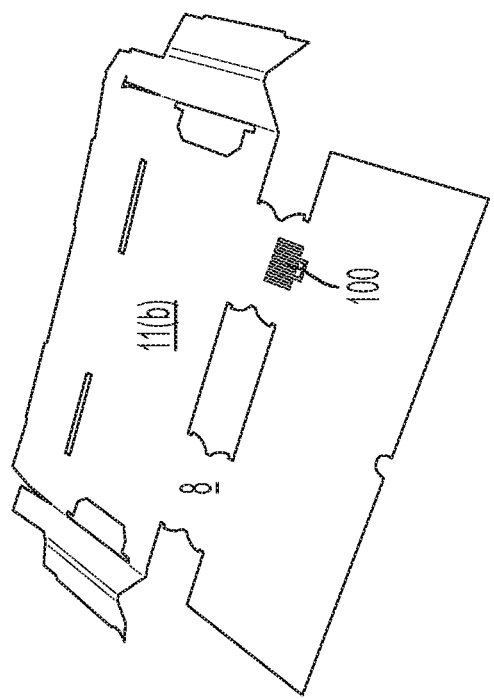
FIG. 4 is a depiction of a sheet for a POP display according to embodiments of the disclosure.
Figure 5:
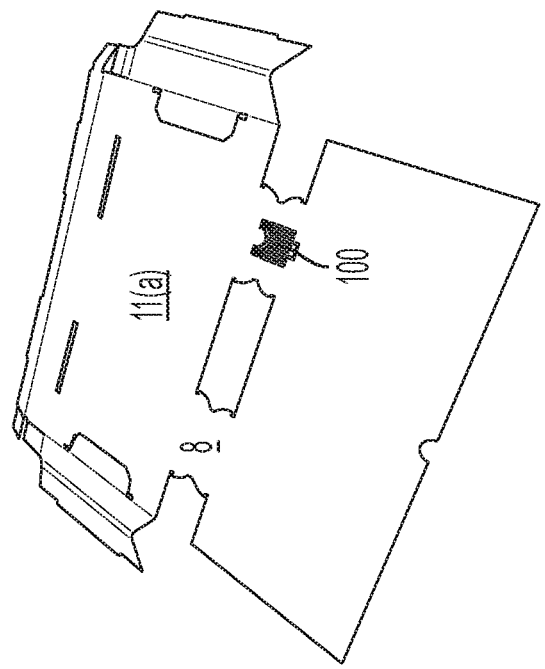
FIG. 5 is a depiction of a sheet for a POP display according to embodiments of the disclosure.

FIG. 4 shows a flat sheet that forms one shelf 11(a) in FIG. 1. FIG. 5 shows a flat sheet that forms one shelf 11(b) in FIG. 1. FIG. 6 shows the bottom wall 12 in FIG. 1. In FIGS. 4 and 5, the sheet is folded over and tabs 8 form for insertion into perforations 9 (FIGS. 2 and 3). The other sides on FIGS. 4 and 5 are folded over to create a double sided wall. In FIG. 6 the sides are folded to create a double wall into which tabs 19 (FIG. 1) are inserted. A printed electronic device 100 is shown in FIGS. 4-6.

The sheets shown in FIGS. 2-6 are foldable. When unfolded the sheets are flat. When folded the sheets can be assembled to form a three dimensional display. The folding and assembly of the sheets is reversible, that is, the sheets can be assembled to form a display and after use, the display can be disassembled and the sheets can be returned to a flat state. This allows easy transportation to a different site.

The folding of the sheets in FIGS. 2-6 is only in one direction. Fold seams are created, for example, by preformed creases, perforations, partially cut sections and the like to provide the folding direction. In FIG. 2, the sidewalls 13 fold upwards. In embodiments, a single sheet can be folded and assembled to make a display. In embodiments, the sheet shown in FIGS. 2 and 3 may include a bottom wall as part of the flat sheet. Such a display, when assembled would not have a shelf.

Figure 7:
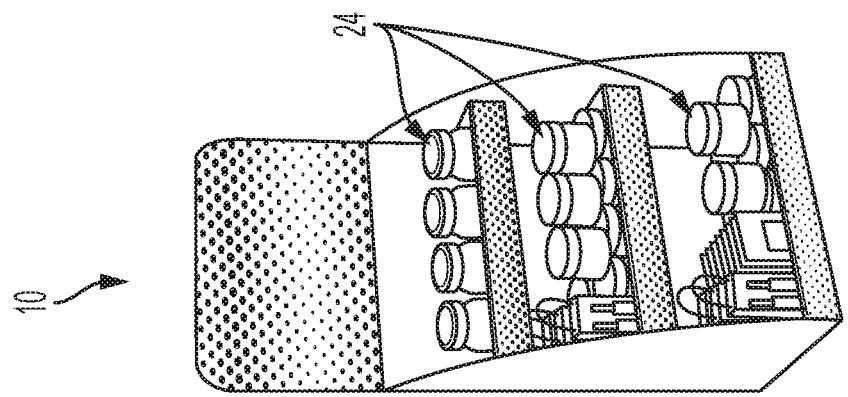
FIG. 7 is a depiction of an empty POP display having sale items displayed according to embodiments of the disclosure.

FIG. 7 shows the assembled POP display 10 with items 24 that are displayed for promotion and sale on the shelves 11(a) and 11(b) and bottom wall 12 (FIG. 1).

FIG. 8 shows the assembled POP display 10 with products for sale removed. The POP display 10 includes a customer interaction device 34 provided on the front wall 15 (FIG. 1). A modular component such as a customer interaction device 34 can include a motion sensor that detects a customer. Customer interaction devices include buttons for the customer to push, a wireless communication method (e.g. blue tooth low energy (BLE), NFC, RFID, Wifi) to interact with a customer's mobile device, an optical sensor or camera to detect a customer. When the customer is detected by the motion sensor a speaker can begin talking to the customer. A controller 30 and power supply 31 are coupled to the customer interaction device 34. In addition, the POP display 10 can include other modular components, such as LEDs 37.

The POP display can include a screen (such as an LCD screen) providing product information, wireless communication with a mobile device (e.g. blue tooth low energy (BLE), Near Field Communication (NFC), Radio Frequency Identification Device (RFID), Wifi), sensors such as touch sensors, temperature and humidity to provide information about the environment or items on the display etc. The LEDs 37 and other modular components are coupled to the microcontroller 30 and power supply 31. The POP display can include other modular components, such as weight sensors 36 that indicate when sales products are removed from the shelves 11 or bottom wall 12 (FIG. 1). Capacitive object sensing, RFID object detection, light sensors, optical sensors can also indicate when products are removed from the shelves.

The modular components such as the customer interaction device 34, display outputs 37 and sensors 36 are coupled to the microcontroller 30 and power supply 31 through printed electronics, such as conductive traces. The printed electronic devices are applied to the substrate. Along with the printed electronic devices, printed graphics can also be applied to the substrate. The application of printed electronic devices can occur on the substrate while it is flat. The application of the printed electronics and printed graphics can occur prior to perforation, cutting or folding of the substrate. Certain modular components such a lights can then be added to the display after the POP display 10 is assembled.

Printed electronic devices can also be printed on pressure sensitive adhesive film. Pressure sensitive adhesive films with graphic designs printed on thereon are compatible with many types of substrates.

Pressure sensitive adhesive films having the printed electronics include printed smart tags. Printed smart tags include functionality such as moisture sensing and NFC communication. These tags are usually attached to each package for individual item monitoring.

Figure 9:
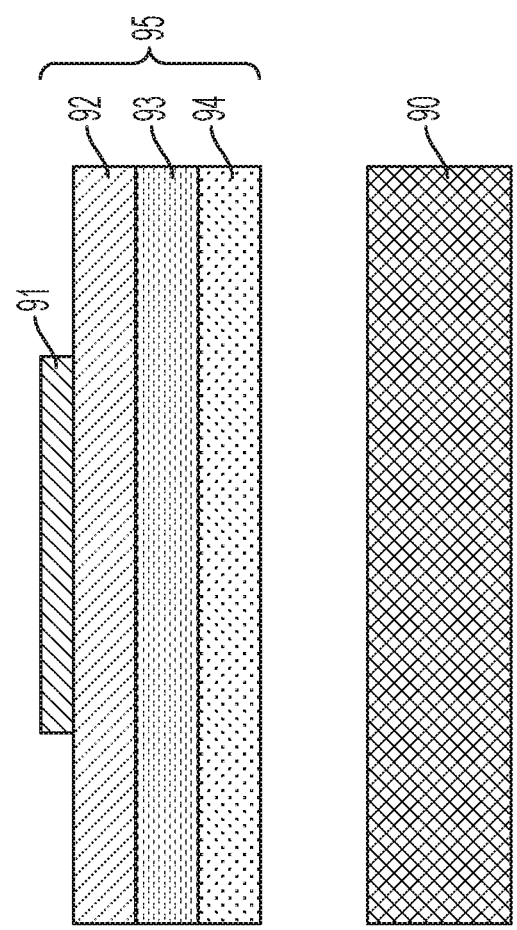
FIG. 9 is a cross-sectional schematic view of a pressure sensitive adhesive film for a POP display according to embodiments of the disclosure.

FIG. 9 shows a cross-sectional view of a pressure sensitive adhesive film 95 having a printed conductive trace 91 forming a printed electronic device. One of the plurality of sheets shown in FIGS. 2-6 is represented by 90. The pressure sensitive adhesive film 95 includes a backing layer 94. The backing layer 94. Disposed on the backing layer 94 is the pressure sensitive adhesive 93. Disposed on the pressure sensitive adhesive 93 is a surface wrap material 92. A conductive trace 91 forming a printed electronic device is disposed on the surface wrap material 92. Application of the pressure sensitive adhesive film 95 to a surface of one of the plurality of sheets for the POP display is accomplished by removing the backing layer 94 and placing the pressure sensitive adhesive film 95 where desired. This is done when the sheets of the POP display are flat and prior to shipping of the flat sheets.

Applying pressure sensitive adhesive film with printed electronics to shelves allows for inventory control or shopper interaction systems by incorporating various technologies onto shelves, including proximity sensors, cameras, microphones, RFID readers, and weight sensors. Using pressure sensitive adhesive film with printed electronics and modular electronic components provides a cost-effective option for replaceable shelves.

Pressure sensitive adhesive films, as a low-cost wrapping layer, allow for easy combination of electronic and graphic components, providing an attractive approach for smart POP display design and fabrication.

The utilization of pressure sensitive adhesive films is an easy and versatile way to integrate modular electronic components onto POP displays. The pressure sensitive adhesive film is compatible with roll-to-roll printing for both conductive inks and traditional graphic inks. Conductive trace patterns are designed using computer software and deposited onto the pressure sensitive adhesive film through digital or analog printing techniques. As the pressure sensitive adhesive film can stick to numerous types of substrates, it overcomes the limitation of poor ink adhesion and low melt temperature plastics. Connecting a microchip or other modular electronic component to the printed conductive traces on the pressure sensitive adhesive in areas of interest on the POP display allows for the incorporation of functionality such as LED indicators, digital price tags, temperature sensors, etc.

To add aesthetic and informative elements to the POP displays, graphics can be printed onto the pressure wrap material 92 before or after the conductive traces 91 forming the printed electronic device are deposited on the surface wrap material 92 of the pressure sensitive adhesive film 95. The pressure sensitive adhesive film 95 is compatible with mass production processes such as roll-to-roll printing.

A fabrication process of printing electronic devices on pressure sensitive adhesive film 95 and using it as a wrapping layer to build a POP display is disclosed herein. The ability to accommodate both conductive and graphic inks makes the pressure sensitive adhesive useful for a POP display. The pressure sensitive adhesive film expands the range of feasible substrate materials by 1) preventing ink incompatibility issues and 2) by enabling direct application of adhesive films onto non-planar POP display surfaces. Through digital printing methods, smart display prototypes can be created in a quick manner, while the mass production techniques such as roll-to-roll printing enable the low-cost manufacturing of functional pressure sensitive adhesive films in large quantities.

Electronics can be printed directly on certain substrates such as surface wrap material 92 of the pressure sensitive adhesive film 95 or surfaces of the sheets forming the POP display, such as cardboard, wood acrylic or metal. The electronics are flexible conductive materials, such as, silver (Ag), gold (Au), carbon (graphene, carbon nanotubes, graphite or carbon black).

The flexible conductive materials can be printed on surface wrap material 92 of the pressure sensitive adhesive films 95 or other substrates to produce the following printed electronic devices; wires or conductive traces, capacitors, (where a dielectric material is deposited between conductive parallel plates), inductors (conductive material is printed a spiral type pattern), transformers (conductive material printed in two overlapped or interlaced spirals), transistors (minimum 3 material device with printed conductor, printed dielectric and printed semiconductor). A voltage applied to the gate changes the current across the transistor (usually by multiple orders of magnitude). The printed electronics on the substrate or pressure sensitive adhesive film also include resistors (a conductive material with a set resistance is printed (typically carbon materials with another filler)), antennas, (conductive material printed in a specific pattern to receive or resonate at a desired frequency and sensors (two plates of conductive material printed with a sensing material between the two plates. An example sensor could measure the current between the plates as a condition changes such as temperature or humidity (the resistance of the sensing material changes causing the current to change). The printed electronic devices include wires, insulators, resistors, capacitors, inductors, transformers, transistors, antennas, printed battery, OLEDs and sensors.

The use of printed electronic devices eliminates the need for loose wires hanging from or hidden within the POP display. The flexible conductive material allow for folding of the substrate in the POP displays without losing the conductivity for the printed electronics. The POP display can be shipped flat and assembled by the user. Traditional pick and place techniques can allow for the addition of modular components such as LEDs, certain antennas, certain sensors and microchips, integrated circuits (IC), resistors, capacitors, power supply, diodes, transistors, inductors, sensors, transducers, switches and transformers. Fabrication of a system involves the physical design of a POP display. Graphics design and placement of electronics, including modular components, are determined through a design program. Printing of the graphics and printed electronics occurs on the substrate of the POP display before it is cut, perforated and/or folded. Printing of the graphics and application of a pressure sensitive adhesive film having printed electronics occurs on the substrate of the POP display before it is cut, perforated and/or folded. Surface mount electronics are then be added to the POP display. A controller or microcontroller is programmed before or after being added to the POP display.

Printing of the electronics on a substrate or surface wrap material 92 of the pressure sensitive adhesive film 95 can be by using analogue or digital print techniques such as gravure, flexography, inkjet printing, screen printing, aerosol jet printing, extrusion printing, and other established print techniques to apply to the flexible conductive materials to the substrate or the pressure sensitive adhesive film. The disclosure herein is compatible with established manufacturing techniques.

The form factor of pressure-sensitive adhesive film 95 is compatible with industrial manufacture processes such as roll-to-roll printing. Because the pressure sensitive adhesive film 95 is wrapped on to the POP display, the form factor of the display does not need to be altered to allow for the addition of electronics The pressure sensitive adhesive films 95 with conductive traces 91 forming printed electronic devices can be handled flat and can be folded, making them easy to ship and assemble. The pressure sensitive adhesive film having a printed electronic device can be directly wrapped onto surfaces. The pressure sensitive adhesive films have good adhesion to numerous types of substrates, even those incompatible with the conductive inks or printing processes. Graphics can be easily printed onto the surface wrap material 92 of the pressure sensitive adhesive films 95 to provide information and decoration.

Utilizing flexible conductive materials, such as inks of Ag, Cu, Au or carbon (graphene, carbon nanotubes, graphite and carbon black) for the printed electronics removes the need for wiring after assembly of the POP display.

Connection devices for the modular components include low temperature solder having a melt temperature of 138° C. to 188° C. or conductive adhesive. A pogo pin connector or a magnetic connector or a cable connector can also be coupled to the printed electronics and serve as a connection device. The connection device allows for the modular components to be connected through the printed electronics to the power supply and controller.

A controller can connect to the printed electronics to form a completed POP display. The controller can use a wired or wireless connection such as bluetooth, Zigbee (not an acronym), WiFi, Long Range Wide Area Network (LoRaWAN), Global System for Mobile communications (GSM) etc. to connect to a central control unit or a mobile device. Connection to the controller can allow for the display to be updated, upload gathered data to the central hub and or interact with mobile devices. It can also allow one central control unit to interact with multiple electronic components. Electronic components such as buttons, touch sensors, lights/LEDs/OLEDs, antenna, audio and other components can also be printed or attached using surface mount technology.

Figure 10:
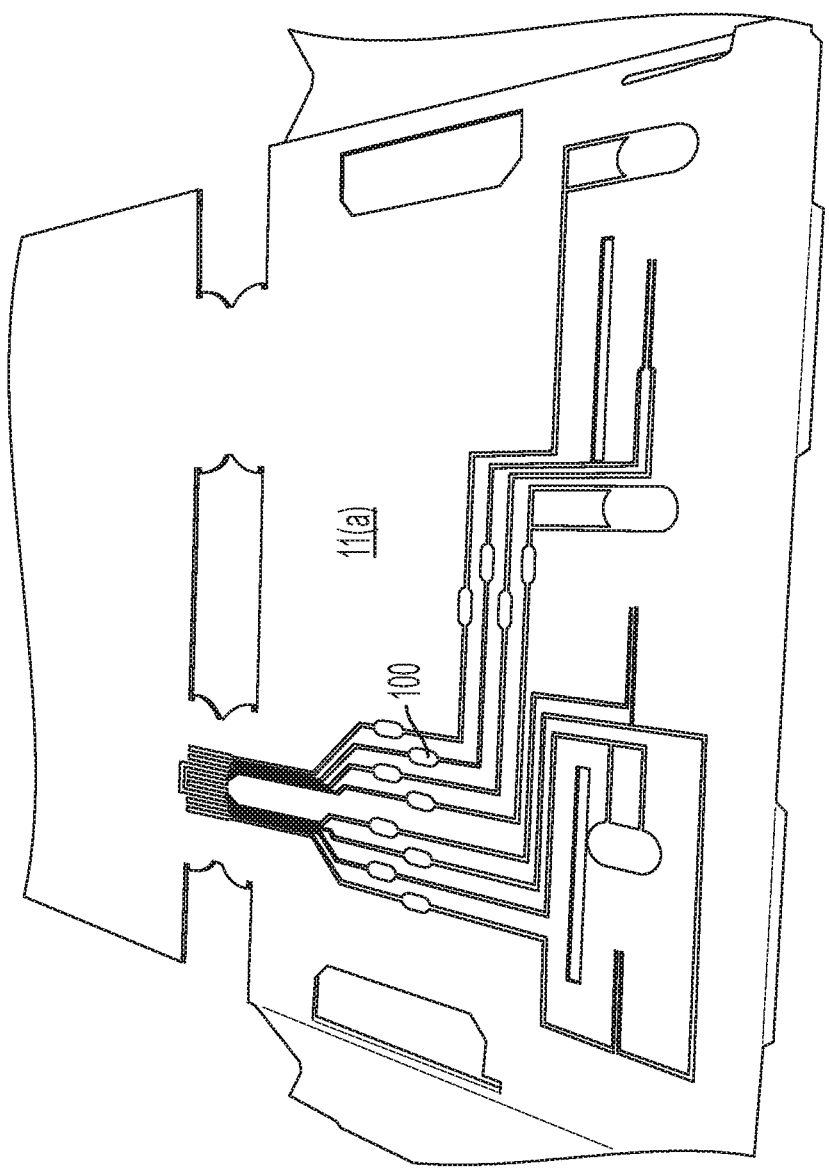
FIG. 10 is a depiction of a sheet for a POP display according to embodiments of the disclosure.

FIG. 10 shows screen printed electronic devices 100 on shelf 11(a) of FIG. 4. The printed electronic devices 100 in the embodiment of FIG. 10 are conductive traces. The printed electronic devices 100 can be affixed directly to various surfaces of the flat sheets (FIGS. 2-6) of the unassembled POP display. The flat sheets with the printed electronic devices 100 are then assembled forming the POP display. The printed electronic devices 100 on the various sheets electrically couple together.

The POP display disclosed herein can utilize a central controller. From it a set of components can be added to provide the features desired. Power can be supplied either from a wired connection, an on board battery (cell or thin film) or wirelessly. The POP display can include traditional graphics and graphic based interactions such as barcodes, QR codes and Digimarc, and will also contain a base set of printed electronics on pressure sensitive adhesive film and add on modular electronic components. The controller and power supply can be shipped separately from the flat sheets of the POP display or provided by the customer on site.

The base components common to all designs to develop a POP display will include: a controller or microcontroller; a power supply, such as a cabled connection, battery, thin film battery, or wireless energy and printed electronics as described above. The printed electronics connect components on the POP display and the controller.

The connection protocol to connect the controller or other modular components to the printed electronics includes a connection device such as a pogo pin connection, magnetic connection, cable connector, low temperature solder having a melting temperature of from 138° C. to 188° C., conductive adhesive or ribbon cable. The modular components and connection device can be shipped separately from the flat sheets of the POP display or provided by the customer on site.

The modular electronic components include; lighting, visual indicators such as LEDs; sensors, e.g. capacitive touch, pressure, proximity, temperature, antennas; electronic tagging, e.g. RFID—For communication, customer interaction, wireless power etc; audio, speakers, voice interaction, and electronic displays—LCD, LED, OLED etc.

The communication method of the POP display may include Bluetooth, Zigbee, WiFi, LoRaWAN, GSM etc. The POP display provides interaction features—touch points, buttons etc.

The POP display can have the capability swap modular electronic components by changing only a portion of the POP display where the modular components are located. For example, the POP display can contain removable shelves. Each shelf can be changed for a different shelf of the same form factor but containing different modular electronic components. It will then connect in the back of the system to the controller or microcontroller and perform a new function. As long as the modular electronic components are compatible with the controller microcontroller, the new shelf can function.

An example of this would be a shelf with 6 red LED indicator lights. To change the color of the lights, the shelf could be removed and a new shelf inserted with a new color combination of LED lights such as 3 green and 3 blue.

Another example can include a shelf providing capacitive object sensing. This shelf can be removed and replaced by a shelf liner containing optical object sensing.

Example Interactions with a Smart POP Display

Some examples of POP display designs and interactions are disclosed herein. When there is no communication to a processor, a customer interacts with the interaction point on the POP display, inputting their product preferences (e.g. a coffee stand with the selections dark roast, Colombian coffee, etc.). The microcontroller on the POP display outputs a signal to light up LED(s) for products corresponding to the customers chosen preferences. A customer taps a point on the unit stating they want to know more about a product. The POP display then wirelessly interacts with their mobile providing additional product information.

When there is communication of the POP display with a central control unit. The central control unit contains a customer interaction point such as a touch panel or screen. Once the customer has input their settings (e.g. a coffee stand with the selections dark roast, Colombian coffee, etc.), the central control unit wired or wirelessly communicates to the POP display to indicate which items on the POP display meet these criteria by a simple method such as turning on an LED. The central control unit can update the microcontroller on the display to indicate to store employee(s) which products on the POP display need to be changed to new inventory. The controller or microcontroller on POP display can communicate with the central hub providing information about customer interaction with the POP display.

An update can be provided by a central hub to the POP display through wireless communication to update. The communication is received by the controller on the POP display and is updated.

While the embodiments have been described in detail with reference to specific and preferred embodiments, it will be appreciated that various modifications and variations will be apparent to the artisan. All such modifications and embodiments as may readily occur to one skilled in the art are intended to be within the scope of the appended claims.

What is claimed is:

1. A point-of-purchase display comprising:
one or more sheets, the one or more sheets when unfolded and assembled forming the display, the display having a back wall, a front wall, at least a side wall and a bottom wall, a printed electronic device comprising a pressure sensitive adhesive film affixed to a surface of the one or more sheets, a surface wrap material disposed on the pressure sensitive adhesive film and at least one conductive trace disposed on the pressure sensitive adhesive film, wherein the printed electronic device is selected from the group consisting of: capacitors, inductors, transformers, transistors, OLEDs and sensors, wherein the at least one conductive trace is selected from the group consisting of: silver, gold, carbon nanotubes, graphene, graphite and carbon black;
a microcontroller electrically coupled to the printed electronic device;
a connection device to the printed electronic device; and
a modular electronic component coupled to the connection device.

2. The point-of-purchase display according to claim 1, wherein the modular electronic component is selected from the group consisting of: a sensor, a light, an antenna, an audio component, a wireless communication device, an integrated circuits (IC), a resistor, a capacitor, a power supply, a diode, a transistor, an inductor, a transducer, a switch and a transformer.

3. The point-of-purchase display according to claim 1, wherein the connection device is selected from the group consisting of: a pogo pin connector, a magnetic connector, a cable connector, a conductive adhesive, a low temperature solder having a melt temperature of 138° C. to 188° C., and a ribbon cable.

4. The point-of-purchase display according to claim 1, wherein the one or more sheets are a material selected from the group consisting of: cardboard, wood, metal and acrylic.

5. The point-of-purchase display according to claim 1, wherein the one or more sheets includes at least one shelf.

6. The point-of-purchase display according to claim 1, further comprising a power supply capable of being coupled to the printed electronic device.

7. A point-of-purchase display comprising:
one or more sheets, which when unfolded and assembled forming the display comprising a back wall, a front wall, at least one side wall, at least one a shelf, and a bottom wall, wherein a printed electronic device comprises a pressure sensitive adhesive film, a surface wrap material disposed on the pressure sensitive adhesive film and at least one conductive trace disposed on the pressure sensitive adhesive film, wherein the printed electronic device is affixed to a surface one of the one or more sheets, wherein the printed electronic device is selected from the group consisting of: capacitors, inductors, transformers, transistors, OLEDs and sensors, wherein the at least one conductive trace is selected from the group consisting of: silver, gold, carbon nanotubes, graphene, graphite and carbon black;
a microcontroller electrically coupled to the printed electronic device;
a connection device electrically coupled to the printed electronic device; and
a modular component electrically coupled to the connection device.

8. The point-of purchase display according to claim 7, wherein the modular component is selected from the group consisting of: a sensor, a light, an antenna, an audio component, a wireless communication device, an integrated circuits (IC), a resistor, a capacitor, a power supply, a diode, a transistor, an inductor, a transducer, a switch and a transformer.

9. The point-of purchase display according to claim 7, wherein the connection device is selected from the group consisting of: a pogo pin connector, a magnetic connector, a cable connector, a conductive adhesive, a low temperature solder having a melt temperature of 138° C. to 188° C. and a ribbon cable.

10. A method of providing a point-of-purchase display comprising:
shipping one or more sheets to a site, the one or more sheets forming a back wall, a front wall, at least one side wall, and a bottom wall, wherein a printed electronic device comprising a pressure sensitive adhesive film, a surface wrap material disposed on the pressure sensitive adhesive film and at least one conductive trance disposed on the pressure sensitive adhesive film, wherein the printed electronic device is affixed to a surface one the one or more sheets, wherein the printed electronic device is selected from the group consisting of: capacitors, inductors, transformers, transistors, OLEDs and sensors, wherein the at least one conductive trace is selected from the group consisting of: silver, gold, carbon nanotubes, graphene, graphite and carbon black wherein the one or more sheets are foldable and capable of being assembled into a three dimensional display.

11. The method according to claim 10, further comprising:
coupling a microcontroller, a power supply, a connection device and a modular component device to the printed electronic device.

12. The method according to claim 11, wherein the modular electronic component is selected from the group consisting of: a sensor, a light, an antenna, an audio component, a wireless communication device, an integrated circuits (IC), a resistor, a capacitor, a power supply, a diode, a transistor, an inductor, a transducer, a switch and a transformer.

13. The method according to claim 11, wherein the connection device is selected from the group consisting of: a pogo pin connector, a magnetic connector, a cable connector, a conductive adhesive, a low temperature solder having a melt temperature of 138° C. to 188° C., and a ribbon cable.

14. The method according to claim 10, wherein the front wall and back wall and the at least one side wall comprise a single flat sheet.

* * * * *